US008039969B2

(12) United States Patent
Kurita

(10) Patent No.: US 8,039,969 B2
(45) Date of Patent: Oct. 18, 2011

(54) SEMICONDUCTOR DEVICE

(75) Inventor: Yoichiro Kurita, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 638 days.

(21) Appl. No.: 11/542,128

(22) Filed: Oct. 4, 2006

(65) Prior Publication Data
US 2007/0080467 A1 Apr. 12, 2007

(30) Foreign Application Priority Data

Oct. 7, 2005 (JP) ................................. 2005-294710

(51) Int. Cl.
H01L 23/52 (2006.01)
(52) U.S. Cl. ........ 257/777; 257/682; 257/686; 257/778; 257/E23.031; 257/E25.013
(58) Field of Classification Search .................. 257/682, 257/686, 777, 778, E25.013, E23.013, E23.031
See application file for complete search history.

(56) References Cited

U.S. PATENT DOCUMENTS

| 6,297,072 | B1* | 10/2001 | Tilmans et al. | 438/106 |
|---|---|---|---|---|
| 6,750,521 | B1* | 6/2004 | Chilcott et al. | 257/414 |
| 6,853,067 | B1* | 2/2005 | Cohn et al. | 257/704 |
| 2004/0066258 | A1* | 4/2004 | Cohn et al. | 335/78 |
| 2004/0197953 | A1* | 10/2004 | Funk | 438/108 |
| 2005/0109455 | A1* | 5/2005 | Bai | 156/292 |
| 2006/0043604 | A1* | 3/2006 | Suga et al. | 257/778 |
| 2006/0097335 | A1* | 5/2006 | Kim et al. | 257/433 |
| 2006/0216856 | A1* | 9/2006 | Zhao | 438/106 |

FOREIGN PATENT DOCUMENTS

| JP | 61-89657 | 5/1986 |
|---|---|---|
| JP | 2000-232117 | 8/2000 |
| JP | 2003-17654 | 1/2003 |
| JP | 2004-128288 | 4/2004 |

OTHER PUBLICATIONS

Japanese Office Action dated Sep. 14, 2010, with partial English translation.
Bernard Levine, "System-In-Package: Growing Markets, Ongoing Uncertainty", Semiconductor Manufacturing, Mar. 2004, pp. 47-61.
Japanese Office Action dated Jul. 5, 2011 (with an English translation).

* cited by examiner

Primary Examiner — Eugene Lee
Assistant Examiner — Peniel M Gumedzoe
(74) Attorney, Agent, or Firm — McGinn IP Law Group, PLLC

(57) ABSTRACT

A semiconductor device 1 includes a semiconductor chip 10 (first semiconductor chip), a semiconductor chip 20 (second semiconductor chip) and a seal ring 30. The semiconductor chip 20 is provided on a surface S1 of the semiconductor chip 10 so as to be spaced apart from the semiconductor chip 10 with a predetermined spacing therebetween. A seal ring 30 is interposed between the semiconductor chip 10 and the semiconductor chip 20. An internal region, which is an inner region of the seal ring 30, and an external region, which is an outer region of the seal ring 30, are provided between the semiconductor chip 10 and the semiconductor chip 20.

20 Claims, 8 Drawing Sheets

SEMICONDUCTOR DEVICE

This application is based on Japanese patent application No. 2005-294710, the content of which is incorporated hereinto by reference.

BACKGROUND

1. Technical Field

The present invention relates to a semiconductor device.

2. Related Art

Conventional semiconductor devices include those disclosed in the patent document 1 and the non-patent document 1, cited below. In the semiconductor device described in the patent document 1, a second semiconductor chip is flip-chip mounted on a first semiconductor chip. A gap between the first and the second semiconductor chips is filled with an underfill resin.

(Patent document 1) Japanese Laid-open patent publication No. 2003-17654
(Non-patent document 1) Bernard Levine, "SYSTEM-IN-PACKAGE: Growing Markets, Ongoing Uncertainty", SEMICONDUCTOR MANUFACTURING, March 2004, pp. 47 to 61

Meanwhile, in the semiconductor device described in the non-patent document 1, a second semiconductor chip is disposed on a first semiconductor chip through seal ring therebetween. The second semiconductor chip has smaller area than the first semiconductor chip, and is provided on a region of the first semiconductor chip. The above-described seal ring is provided along an edge of the second semiconductor chip. This provides an airtight sealing by the seal ring for a region between the first and the second semiconductor chips. In this air-tightly sealed region, both chips are electrically connected to each other via a connecting terminal.

SUMMARY OF THE INVENTION

In the semiconductor device of the patent document 1, the connection reliability between the first and the second semiconductor chips is assured by filling a gap between those chips with an underfill resin. However, when too much smaller spacing is provided between the conductive members such as a bump for connecting both chips, it becomes difficult to sufficiently fill the spacing between the chips with the underfill resin. This disturbs a high-density formation of the above-described conductive members. In other words, an improvement in the connection density between both chips is disturbed.

On the contrary, according to the semiconductor device of the non-patent document 1, a spacing between the first and the second semiconductor chips is air-tightly sealed with a seal ring, so that a certain connection reliability between both chips can be maintained for longer term, without a need for filling the spacing with an underfill resin. Therefore, it is preferable to provide a seal ring between the first and the second semiconductor chips, in view of improving a connection density between both chips.

On the other hand, in the semiconductor device of the non-patent document 1, a signal path for picking up a signal of the second semiconductor chip to the outside should be provided so as to detour around the seal ring. Therefore, a signal of the second semiconductor chip is picked up to the outside through an internal interconnect of the first semiconductor chip. Accordingly, an electric resistance through the signal path is increased, leading to a deterioration of electrical characteristics of the semiconductor device.

According to the present invention, there is provided a semiconductor device, comprising a first semiconductor chip; a second semiconductor chip, provided on one side of the first semiconductor chip, spaced apart from the first semiconductor chip with a predetermined distance; and a seal ring provided between the first and the second semiconductor chips, wherein an internal region, which is an inner region of the seal ring, and an external region, which is an outer region of the seal ring, are provided between the first and the second semiconductor chips.

In this semiconductor device, the region (internal region) that is surrounded by the seal ring and the region (external region) that is not surrounded by the seal ring are provided between the first and the second semiconductor chips. This configuration achieves that both chips can be electrically connected in the external region, in addition to in the internal region. Therefore, by utilizing such external region, a signal of one of the chips can be picked up without transferring the signal through an internal interconnect of the other chip. Consequently, a reduced electric resistance through the signal path can be provided.

According to the present invention, the semiconductor device exhibiting improved electrical characteristics can be achieved.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Preferable embodiments for illustrating a semiconductor device will be described in detail, in reference to the annexed figures. In all figures, identical numeral is assigned to an element commonly appeared in the figures, and the explanation thereof will not be repeated.

First Embodiment

Figure 1:
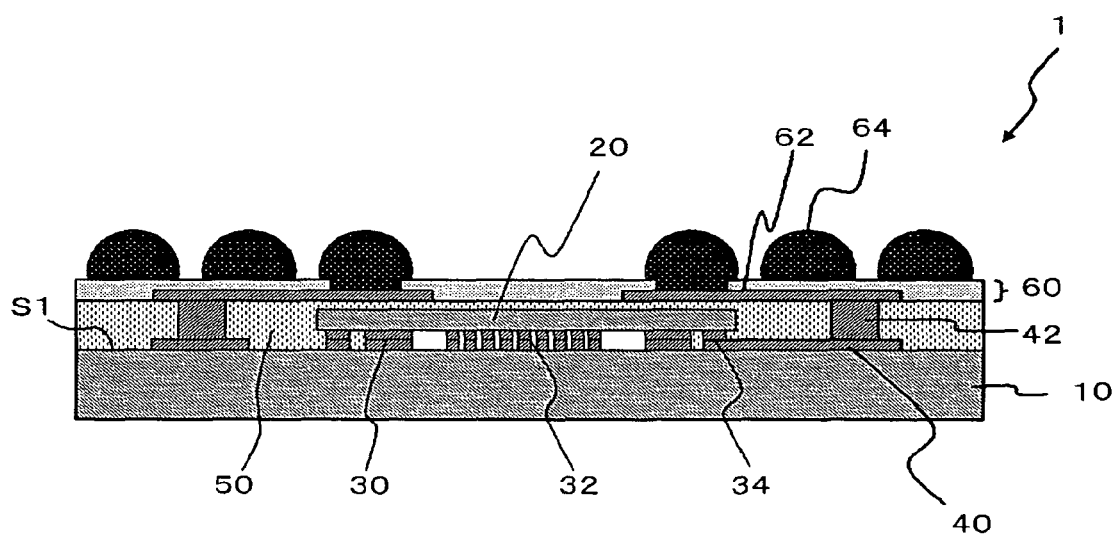
FIG. 1 is a cross-sectional view, illustrating a semiconductor device of the first embodiment according to the present invention.

FIG. 1 is a cross-sectional view of a semiconductor device, illustrating a configuration of a semiconductor device of the first embodiment according to the present invention. A semiconductor device 1 includes a semiconductor chip 10 (first semiconductor chip), a semiconductor chip 20 (second semiconductor chip) and a seal ring 30.

The semiconductor chip 20 is provided on the surface S1 of the semiconductor chip 10 so as to be spaced apart from the semiconductor chip 10 with a predetermined spacing therebetween. In the present embodiment, the semiconductor chip 10 has a larger chip area than the semiconductor chip 20 has. The semiconductor chip 10 and semiconductor chip 20 are, for example, a memory chip and a logic LSI chip, respectively.

Figure 2:
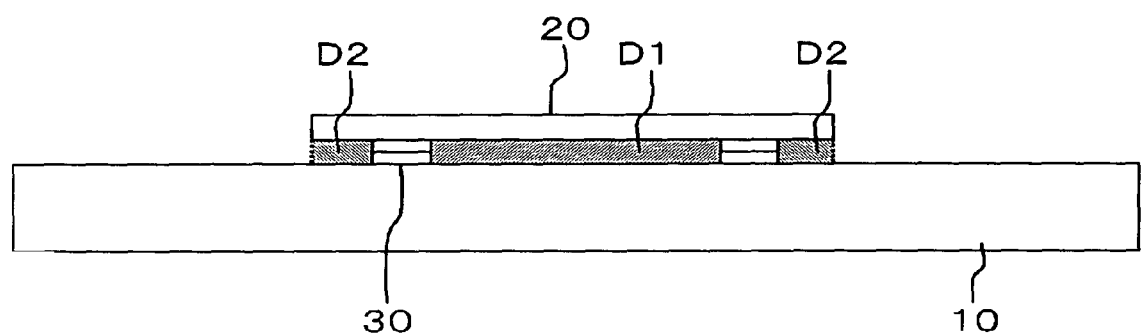
FIG. 2 is a cross-sectional view, useful for describing an internal region and an external region in the semiconductor device shown in FIG. 1.

A seal ring 30 is interposed between the semiconductor chip 10 and the semiconductor chip 20. More specifically, the semiconductor chip 20 is disposed on the semiconductor chip 10 via the seal ring 30. As shown in FIG. 2, an internal region D1, which is an inner region of the seal ring 30, and an external region D2, which is an outer region of the seal ring 30, are provided between the semiconductor chip 10 and the semiconductor chip 20. In the diagram, among various components of the semiconductor device 1, the semiconductor chips 10, 20 and the seal ring 30 are only illustrated, and other components are not shown.

The internal region D1 is air-tightly sealed by being wrapped with the seal ring 30. The interior of the internal region D1 may be in a condition of being filled with an inert gas such as nitrogen or argon, or may be in a vacuum condition. On the other hand, the external region D2 is not wrapped with the seal ring 30. The region D2 is filled with an insulating resin, which composes an insulating resin layer 50 as will be discussed later.

A conductive member 32 (first conductive member) and a conductive member 34 (second conductive member) are formed in the internal region D1 and external region D2, respectively. The conductive members 32, 34 serve as an electrical connecting unit for electrically connecting the semiconductor chip 10 and the semiconductor chip 20. These conductive members 32, 34 are composed of the conductive material that is same as the material composing the seal ring 30.

Figure 3:
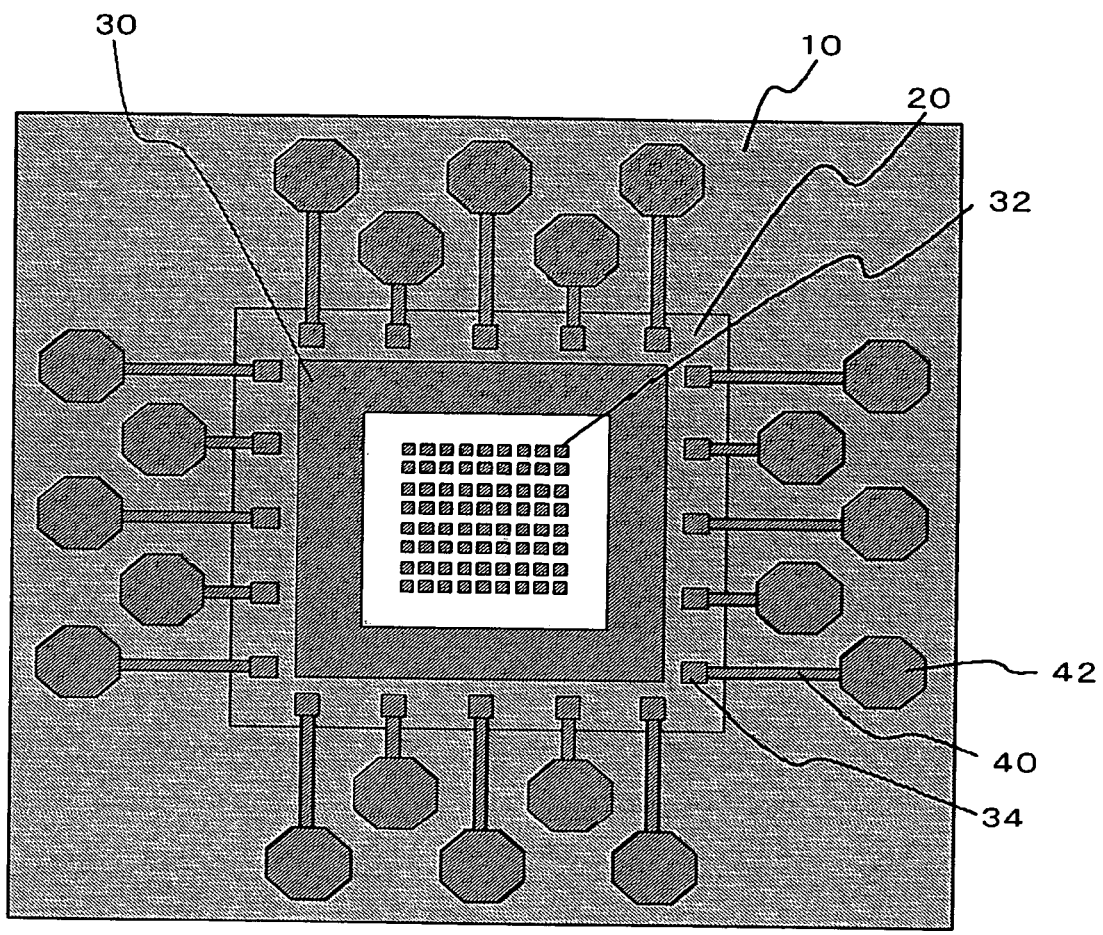
FIG. 3 is a plan view, illustrating the semiconductor device of the first embodiment according to the present invention.

FIG. 3 is a plan view for illustrating the semiconductor device 1. In the diagram, the insulating resin layer 50, the interconnect layer 60, the interconnect 62 and the external electrode terminal 64 as will be discussed later are not shown, and on the other hand, a portion hidden behind of the semiconductor chip 20 (spacing portion between the semiconductor chip 10 and the semiconductor chip 20) is illustrated. As can be seen from the diagram, the array pitch of the conductive members 32 is smaller than that of the conductive members 34. The array pitches of the conductive members 32 and of the conductive members 34 are, for example, 1 μm and 10 μm, respectively. Further, area of the conductive member 32 in plan view is smaller than that of the conductive member 34.

Now returning to FIG. 1, an interconnect 40 is formed on the surface S1 of the semiconductor chip 10. The above-described conductive member 34 is connected to the interconnect 40. Further, the insulating resin layer 50 (insulating layer), which covers the semiconductor chip 20, is formed on the surface S1 of the semiconductor chip 10. The conductor post 42 (conductor plug), which is connected to the interconnect 40, is embedded in the insulating resin layer 50.

On the insulating resin layer 50 is provided with an external electrode terminal 64 via the interconnect layer 60. The external electrode terminal 64 is electrically connected to the conductor post 42. More specifically, the external electrode terminal 64 is directly connected to the interconnect 62 formed in the interconnect layer 60, and the interconnect 62 is directly connected to the conductor post 42. Having such configuration, the external electrode terminal 64 is electrically connected to the above-described conductive member 34.

Figure 4A:
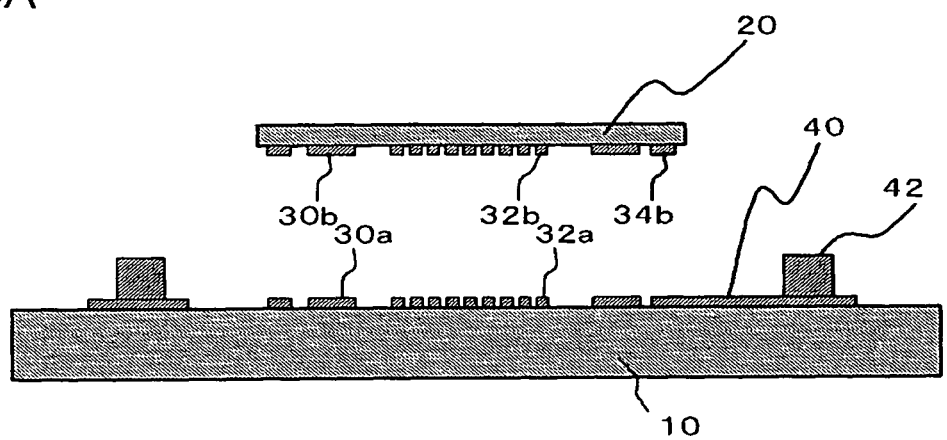
FIGS. 4A and 4B are cross-sectional views, illustrating one example of a method for manufacturing the semiconductor device shown in FIG. 1.

An exemplary implementation of a method for manufacturing the semiconductor device 1 will be described, in reference to FIGS. 4A, 4B, 5A and 5B. First of all, the semiconductor chips 10 and 20 are prepared. In this case, it is preferable that the semiconductor chip 10 is in a wafer state. Then, a seal ring 30a, electrodes 32a and interconnects 40 are formed on the semiconductor chip 10. Copper (Cu), for example, may be employed for materials for composing the seal ring 30a, the electrode 32a and the interconnect 40. Thereafter, the conductor post 42 is formed on the interconnect 40. The conductor post 42 may be formed by, for example, a plating process that utilizes the interconnect 40 as an electrically feeding layer. Further, a seal ring 30b, electrodes 32b and electrodes 34b are formed on the semiconductor chip 20 (FIG. 4A).

The seal ring 30b, the electrodes 32b and the electrodes 34b may be configured to have, for example, a multiple-layered structure of a copper (Cu) film and a tin (Sn) film. More specifically, these may be composed of a Cu film formed on the semiconductor chip 20 and a Sn film formed thereon.

Figure 4B:
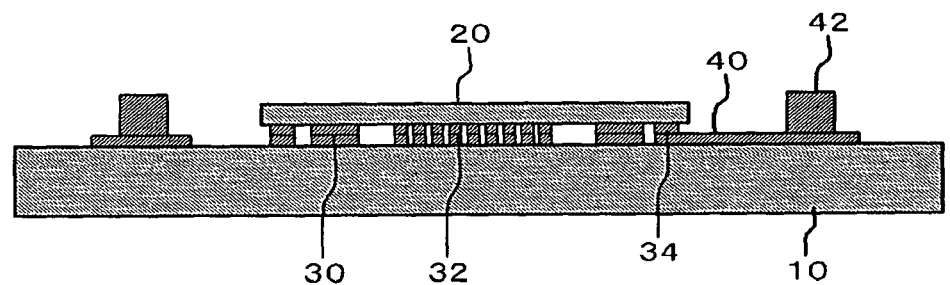

Subsequently, the semiconductor chips 10, 20 are joined to each other. This forms the seal ring 30 composed of the seal ring 30a and the seal ring 30b, the conductive member 32 composed of the electrodes 32a and the electrodes 32b, and the conductive member 34 composed of the electrodes 34b and a part of the interconnects 40 (FIG. 4B). In addition to above, the process for joining these chips may be preferably conducted within an inert gas atmosphere or within a vacuum.

Figure 5A:
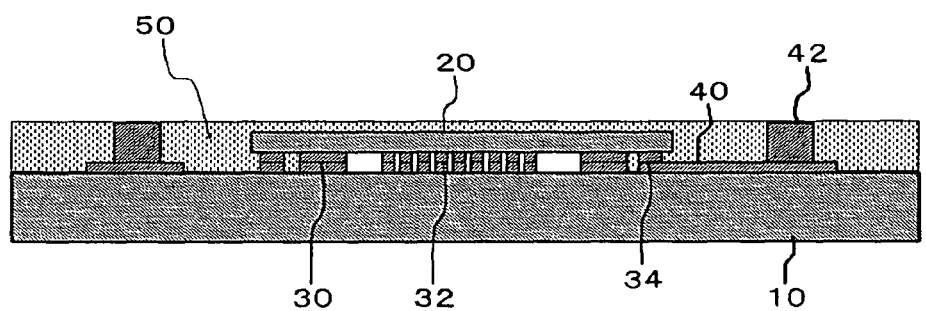
FIGS. 5A and 5B are cross-sectional views, illustrating one example of a method for manufacturing the semiconductor device shown in FIG. 1.

Next, an insulating resin layer 50 is formed on the semiconductor chip 10 by a molding process, a printing process or a spin coating process. This configuration provides an encapsulation of the above-described external region D2 (see FIG. 2) with an insulating resin (FIG. 5A). Such insulating resin layer 50 may be preferably formed within a vacuum. In addition to above, after the insulating resin layer 50 is formed, the insulating resin layer 50 may be ground, if necessary, in order to expose the conductor post 42 in the surface of the insulating resin layer 50.

Figure 5B:
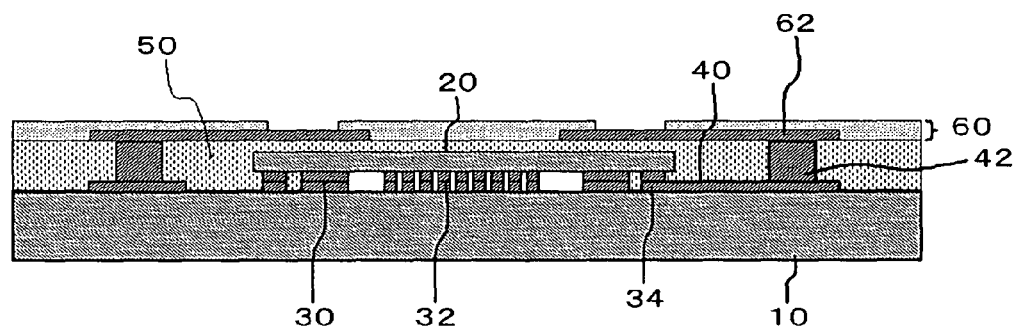

Subsequently, an interconnect layer 60 including interconnects 62 is formed (FIG. 5B). Further, external electrode terminals 64, which are connected to the interconnects 62, are formed. When the above-described operations are conducted while the semiconductor chip 10 is in a wafer state, an operation for dividing the semiconductor chip 10 into individual units by a process such as a dicing process is then carried out. As described above, the semiconductor device 1 shown in FIG. 1 is obtained.

Advantageous effects obtainable by employing the aspects of the present embodiment will be described. In the semiconductor device 1, an internal region, which is surrounded by the seal ring 30, and an external region, which is not surrounded by the seal ring 30, are provided between the semiconductor chip 10 and the semiconductor chip 20. This configuration provides enabling an electrical connection of the both chips in the external region, in addition to the internal region. Actually, in the semiconductor device 1, the semiconductor chips 10 and 20 are mutually connected by the conductive member 34 provided in the external region. Therefore, such conductive member 34 in this external region can be utilized, so that a signal of the semiconductor chip 20 can be picked up without transferring the signal through an internal interconnect of the semiconductor chip 10. Consequently, a reduced electric resistance through the signal path can be provided. This achieves the semiconductor device exhibiting improved electrical characteristics.

Further, since the internal region is air-tightly sealed with the seal ring 30, a certain connection reliability between the semiconductor chips 10, 20 can be maintained for longer term, without a need for filling the region with an underfill resin. Further, since an introduction of an underfill resin is not required, a high-density formation of the above-described conductive members 32 can be achieved. More specifically, a high-density connection between the chips 10 and 20 can be achieved.

The conductive member 34 is connected to the interconnect 40 provided on the surface S1 of semiconductor chip 10, and thus it is configured that the signal of the semiconductor chip 20 can be picked up to the outside through the interconnect 40. The interconnect 40 can be designed to have larger width and thickness, as compared with interconnects formed in the semiconductor chip 10. Thus, an electric resistance through the signal path from the semiconductor chip 20 to the outside of the semiconductor device 1 can be further reduced.

The insulating resin layer 50 is provided on the semiconductor chip 10, and the external electrode terminal 64 is provided thereon. Consequently, area of the region where the external electrode terminals 64 can be formed is substantially equivalent to that of the chip having larger area (i.e., semiconductor chip 10). Therefore, the structure suitable for arranging a number of external electrode terminals 64 is achieved.

The conductor post 42 is provided in the insulating resin layer 50. This configuration can provide an electrical connection between the interconnect 40 and the external electrode terminal 64 with a simple structure.

If the internal region is in a condition of being filled with an inert gas or in a vacuum condition, corrosion and the like of conductive member 32 can be effectively prevented. This provides further improved long-term connection reliability between the semiconductor chips 10, 20.

The external region is sealed with the resin, by being filled with the insulating resin. This can provide an effective prevention of corrosion and the like of the conductive member 34. In particular, in the present embodiment, the insulating resin layer 50 is formed over the entire surface of the semiconductor chip 10 except the above-described internal region. This contributes to an improvement in the reliability of the semiconductor device 1.

Further, in the manufacture of the semiconductor device 1, an improved productivity can be obtained if the step such as joining the semiconductor chips 10, 20 is carried out in a stage that the semiconductor chip 10 is in a wafer state. In particular, further improved productivity can be obtained, if the steps until forming the external electrode terminal 64 are conducted while the semiconductor chip 10 is in a wafer state.

If the insulating resin layer 50 is formed in a vacuum condition, the encapsulation of the external region can be achieved while preventing a generation of void.

Second Embodiment

Figure 6:
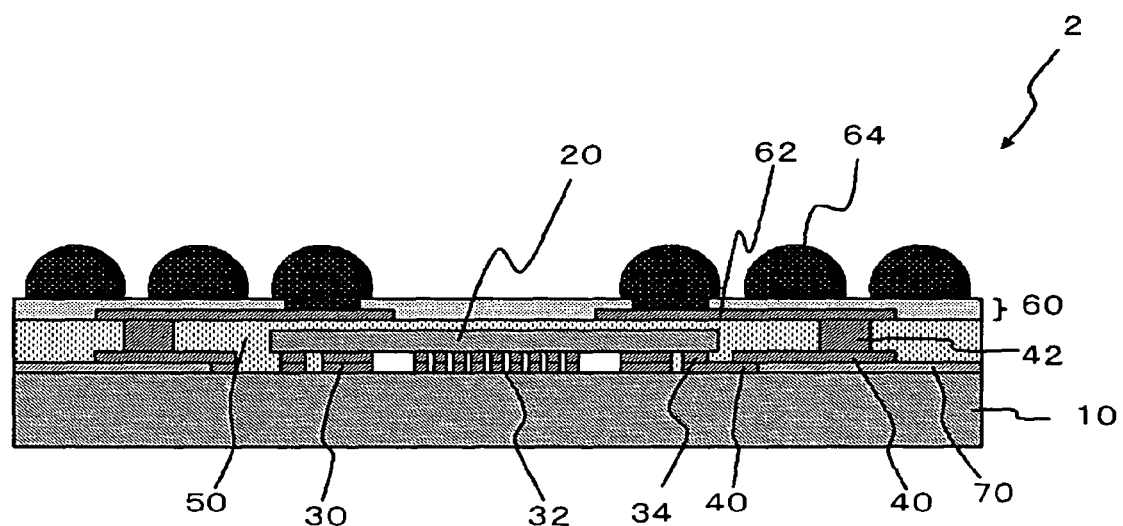
FIG. 6 is a cross-sectional view, illustrating a semiconductor device of the second embodiment according to the present invention.

FIG. 6 is a cross-sectional view, illustrating the second embodiment of a semiconductor device according to the present invention. In the semiconductor device 2, a portion of the interconnect 40 is provided on the surface S1 of the semiconductor chip 10 through the insulating film 70. That is, the insulating film 70 is formed on the semiconductor chip 10, and a portion of the interconnect 40 is formed thereon. More specifically, a portion of the interconnect 40, which is connected to the conductive member 34, is formed directly on the semiconductor chip 10, and meanwhile, a portion thereof connected to the conductor post 42 is formed on the insulating film 70. It is preferable that the insulating film 70 is an organic insulating film. Other configurations of the semiconductor device 2 are similar to those of the semiconductor device 1.

The semiconductor device 2 having such configurations can exhibit the following advantageous effect, in addition to the advantageous effects, which have been described in relation to the semiconductor device 1. More specifically, since the insulating film 70 is interposed between the interconnect 40 and the semiconductor chip 10, a capacity therebetween can be reduced. This leads to an improvement in the electrical characteristics of a drawing interconnect for the external electrode terminal 64.

If an organic insulating film is employed for the insulating film 70, thicker insulating film 70 can be formed, as compared with the case of employing the inorganic insulating film. Thus, a capacity between the interconnect 40 and the semiconductor chip 10 can be further reduced. Further, relatively smaller dielectric constant of the organic insulating film contributes a reduction in the above-described capacity.

Figure 7:
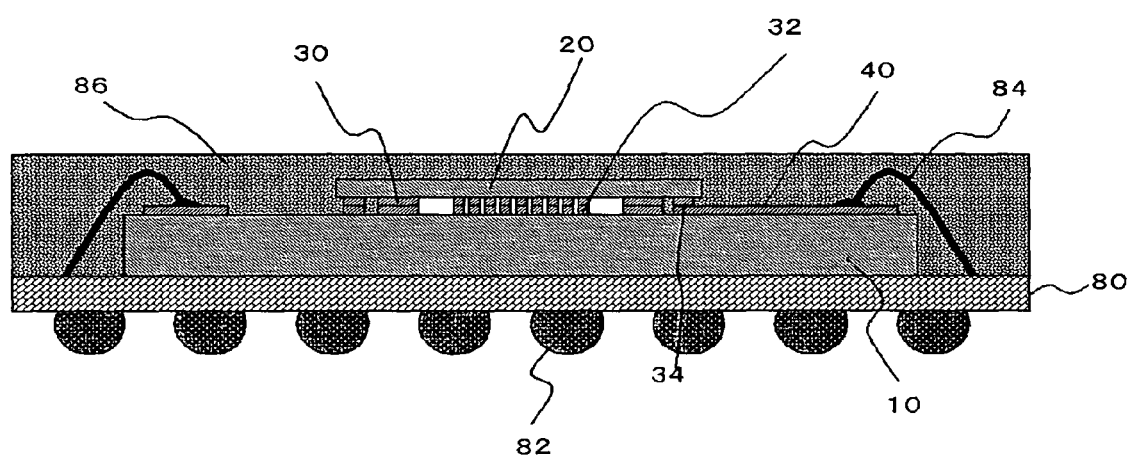
FIG. 7 is a cross-sectional view, illustrating a semiconductor device of an alternative embodiment according to the present invention.

It should be understood that it is not intended to limit the scope of the present invention to these embodiments described above, and it is obvious for a person having ordinary skills in the art that the embodiments described above may be modified without departing from the scope of the present invention. For example, as shown in FIG. 7, the semiconductor device according to the present invention may include a package substrate 80, provided on a side of the semiconductor chip 10, which is opposite to the surface S1, and connected to the semiconductor chip 10 by a wire bonding, and an external electrode terminal 82, provided on a side of the package substrate 80, which is opposite to the side where the semiconductor chip 10 is provided. In the diagram, the semiconductor chip 10 is disposed on the package substrate 80. One end of the wire 84 is connected to the interconnect 40 on the semiconductor chip 10. The other end of the wire 84 is connected to an electrode pad (not shown) disposed on the package substrate 80. Further, a molding resin 86 for covering the semiconductor chips 10, 20 are formed on the package substrate 80.

Figure 8:
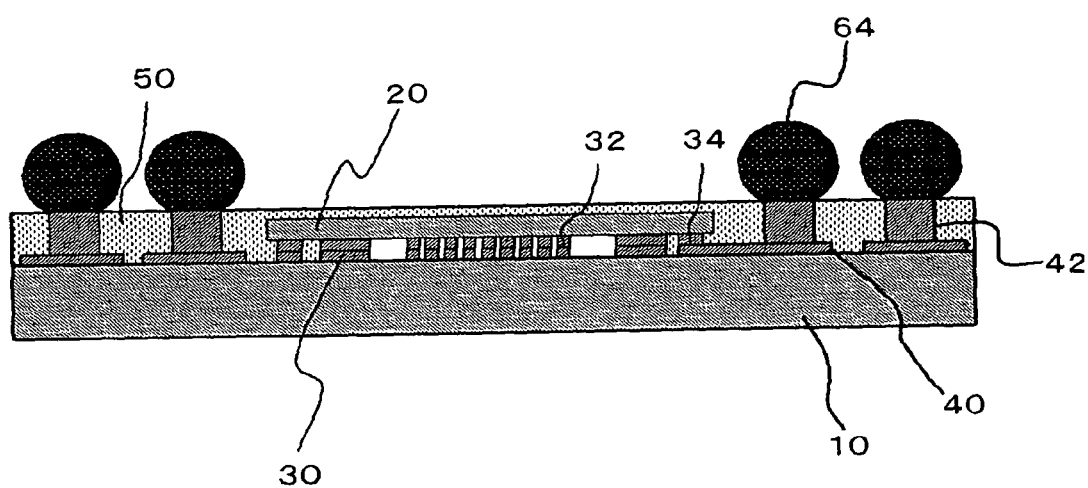
FIG. 8 is a cross-sectional view, illustrating a semiconductor device of another alternative embodiment according to the present invention.

While the configuration of providing a connection between the conductor post 42 and the external electrode terminal 64 through the interconnect layer 60 has been illustrated in each of the above-described embodiments, the conductor post 42 may be directly connected to the external electrode terminal 64, as shown in FIG. 8.

While the configuration of providing the semiconductor chip 20, the side surfaces and the top surface of which are covered with the insulating resin layer 50, has been illustrated in each of the above-described embodiments, only the side surfaces of the semiconductor chip 20 may be covered with the insulating resin layer 50. More specifically, the top surface of the semiconductor chip 20 may be exposed in the surface of the insulating resin layer 50.

It is apparent that the present invention is not limited to the above embodiment, and may be modified and changed without departing from the scope and spirit of the invention.

What is claimed is:

1. A semiconductor device, comprising:
 a first semiconductor chip;

a second semiconductor chip, provided on one side of said first semiconductor chip, spaced apart from said first semiconductor chip with a predetermined distance;

a seal ring provided between said first and said second semiconductor chips, wherein an internal region, which is an inner region of said seal ring, and an external region, which is an outer region of said seal ring, are provided between said first and said second semiconductor chips;

a first conductive member, provided in said internal region, wherein one end of said first conductive member connects to said first semiconductor chip and an other end of said first conductive member connects to said second semiconductor chip;

an interconnect abutting a top surface of said first semiconductor chip; and a second conductive member, provided in said external region, wherein one end of said second conductive member abuts said interconnect and an other end of said second conductive member connects to said second semiconductor chip.

2. The semiconductor device according to claim 1, wherein a portion of said interconnect is provided on said one side of said first semiconductor chip through an insulating film.

3. The semiconductor device according to claim 2, wherein said insulating film comprises an organic insulating film.

4. The semiconductor device according to claim 1, further comprising:

an insulating layer, provided on said one side of said first semiconductor chip, and covering said second semiconductor chip; and an external electrode terminal, provided on said insulating layer, and electrically connected to said second conductive member, wherein said first semiconductor chip has a larger area than said second semiconductor chip.

5. The semiconductor device according to claim 1, further comprising:

an insulating layer, provided on said one side of said first semiconductor chip, and covering said second semiconductor chip;

a conductor plug, provided in said insulating layer, and electrically connected to said interconnect; and an external electrode terminal, provided on said insulating layer, and electrically connected to said conductor plug, wherein said first semiconductor chip has a larger area than said second semiconductor chip.

6. The semiconductor device according to claim 1, wherein said internal region is in a condition of being filled with an inert gas or in a vacuum condition.

7. The semiconductor device according to claim 1, wherein said external region is filled with an insulating resin.

8. A semiconductor device, comprising:

a first semiconductor chip;

a second semiconductor chip, provided on one side of said first semiconductor chip, spaced apart from said first semiconductor chip by a predetermined distance;

a seal ring comprising a multilayer film structure provided between said first and said second semiconductor chips;

wherein an internal region, which is an inner region of said seal ring, and an external region, which is an outer region of said seal ring, are provided between said first and said second semiconductor chips;

an interconnect abutting a top surface of said first semiconductor chip; and a conductive member, one end of said conductive member abutting said interconnect in said external region and an other end of said conductive member abutting said second semiconductor chip in said external region.

9. The semiconductor device according to claim 1, wherein said first conductive member and said second conductive member comprise a same material as said seal ring.

10. The semiconductor device according to claim 8, wherein said multilayer structure comprises a copper (Cu) film and a tin (Sn) film.

11. The semiconductor device according to claim 10, wherein said copper film is formed on said first semiconductor chip, and said tin film is formed on said copper film.

12. The semiconductor device according to claim 5, wherein said interconnect comprises a larger width and thickness and a lower electrical resistance than interconnects formed in said first semiconductor chip.

13. The semiconductor device according to claim 4, wherein an area where said external electrode is formed is substantially equivalent to an area of said first semiconductor chip.

14. The semiconductor device according to claim 7, wherein said insulating resin covers side surfaces of said second semiconductor chip, and a top surface of said second semiconductor chip remains exposed.

15. The semiconductor device according to claim 1, wherein an array pitch of said first conductive member is smaller than an array pitch of said second conductive member.

16. The semiconductor device according to claim 15, wherein said array pitch of said first conductive member is 1 µm, and said array pitch of said second conductive member is 10 µm.

17. The semiconductor device according to claim 1, wherein, in a plan view, an area of said first conductive member is smaller than an area of said second conductive member.

18. The semiconductor device according to claim 8, wherein said first semiconductor chip comprises a memory chip, and said second semiconductor chip comprises a logic LSI chip.

19. The semiconductor device according to claim 1, wherein said first conductive member and said second conductive member have a same height as each other.

20. The semiconductor device according to claim 1, wherein said one end of said second conductive member abuts said interconnect in said external region, and said other end of said second conductive member abuts said second semiconductor chip in said external region.

* * * * *